United States Patent [19]

Dziurla et al.

[11] Patent Number: 4,859,263
[45] Date of Patent: Aug. 22, 1989

[54] PROCESS FOR THE MANUFACTURE OF PRINTED CIRCUITS

[75] Inventors: Heinz-Jürgen Dziurla, Leverkusen; Hans-Leo Weber, Rommerskirchen; Dieter Freitag, Krefeld; Werner Waldenrath, Cologne, all of Fed. Rep. of Germany

[73] Assignee: Bayer Aktiengesellschaft AG, Fed. Rep. of Germany

[21] Appl. No.: 169,830

[22] Filed: Mar. 17, 1988

[30] Foreign Application Priority Data

Apr. 4, 1987 [DE] Fed. Rep. of Germany ....... 3711403

[51] Int. Cl.$^4$ ............................................. B32B 31/26
[52] U.S. Cl. .................... 156/233; 156/234; 156/241; 156/273.9
[58] Field of Search ............... 156/304.4, 196, 219, 156/220, 221, 222, 224, 230, 231, 233, 234, 235, 238, 240, 241, 247, 248, 250, 251, 273.9, 274.4, 274.8, 344, 307.7, 307.3, 324; 174/68.5; 427/96, 271, 272

[56] References Cited

U.S. PATENT DOCUMENTS

| | | |
|---|---|---|
| 2,776,235 | 1/1957 | Peck ...................................... 156/234 |
| 2,925,645 | 2/1960 | Bell ....................................... 156/220 |
| 3,497,410 | 2/1970 | Zagusta ............................... 156/233 |
| 3,547,724 | 12/1970 | Zagusta ............................... 156/233 |
| 4,081,653 | 3/1978 | Koo ...................................... 427/96 |
| 4,372,798 | 2/1983 | Dalton ............................... 156/379.7 |
| 4,427,716 | 1/1984 | Siwek .................................. 156/233 |
| 4,465,538 | 8/1984 | Schmoock ........................... 156/233 |
| 4,525,233 | 6/1985 | Brooks ............................... 156/304.4 |
| 4,568,413 | 2/1986 | Toth ..................................... 156/233 |
| 4,710,253 | 12/1987 | Soszek ............................... 156/272.8 |

FOREIGN PATENT DOCUMENTS

1259837 1/1972 United Kingdom .

*Primary Examiner*—Merrell C. Cashion, Jr.
*Attorney, Agent, or Firm*—Connolly and Hutz

[57] ABSTRACT

A method for manufacturing printed electrical circuits which comprise a substrate and copper foil applied thereto by hot embossing in a predetermined circuit pattern, said method comprising
(a) providing a laminate which comprises the sequence of a printed circuit substrate, a heat activated adhesive layer, a copper foil and a carrier film which is electrically conductive,
(b) passing an electrical current between two electrodes and through the carrier film wherein one electrode has sufficiently large film contact area whereby substantially no resistance heating results from the current density and the other electrode serves as an embossing tool and is of sufficiently small film contact area whereby sufficient resistance heating results from the current density to activate the adhesive layer to bond the copper foil to the substrate in the pattern of said other electrode, and
(c) removing from the laminate the carrier film and such copper foil overlying areas where the adhesive was not heat activated thereby leaving a copper foil pattern bonded to the substrate.

11 Claims, 1 Drawing Sheet

PROCESS FOR THE MANUFACTURE OF PRINTED CIRCUITS

BACKGROUND OF THE INVENTION

The use of printed circuits is widespread in the electrical and electronics industries. Both rigid and flexible materials as well as combinations of the two are used. A distinction is drawn between soldering bathproof systems and those not suitable for soldering baths.

In both, the printed circuit is a non-conductive substrate base and conductive materials in strips on the substrate or base forming an electrical circuit. Frequently glass fiber reinforced epoxy resin sheets, polyimide or polyester films are used as base materials. The generation of the strip conductor image on the substrate, which is originally completely covered with copper, takes place in an etching process. After the substrate layered with a photo-sensitive lacquer has been illuminated with the strip conductor image to be generated, the copper-covered substrate is etched. The copper layering consists of electrolyte copper at a thickness of for example 0.035 mm, attached to the substrate with a heat- and chemical-resistant adhesive. Therefore, for the manufacture of a printed circuit, in addition to the preparation of the photographic pattern, a slow, multi-stage etching process is necessary which must be repeated on each individual piece and must be very accurately controlled in relation to temperatures and concentrations of the agents. Inspite of this, the danger of etching errors, such as under-etching or similar, exists.

For this reason there have been numerous attempts to circumvent the etching process. Thus it was suggested that the strip conductors be manufactured by printing with a lacquer filled with an electrically conducting material. This process is preferred in the manufacture of the base films for membrane switches.

A further process is the transfer of the strip conductors by hot embossing. In this process, the strip conductors are represented raised on an embossing stamp. A synthetic film, for example polyester film, is layered by means of an adhesion imparter (also termed a separating layer) with a special film, whose sealing temperature lies above the melting temperature of the abovementioned separationlayer. With this process strip conductors can be applied to suitable thermoplastic or nonthermoplastic substrates of any shape. In particular, endless printing with roller-shaped embossing tools is possible for large number of pieces.

The object of the present invention was to circumvent certain disadvantages of the above-mentioned embossing process. These disadvantages are in particular;

1. The minimum breadth of the strip conductors must not be less than 0.2 mm.
2. The minimum separation between neighbouring strip conductors must not be less than 0.5 mm.
3. For the generation of high quality printed circuits the maintenance of very exact temperatures of the embossing tool is required, to which end expensive controls are necessary in particular with larger embossing tools.

The present invention avoids the aforementioned disadvantages. It was surprisingly shown that it was possible to fall significantly below the above-mentioned minimum breadth and separations, and thereby significantly extend the possible application of the printed circuits manufactured according to the invention in relation to more densely fitted circuits.

BRIEF DESCRIPTION OF THE INVENTION

The object of the present invention is a process for the manufacture of printed circuits by the application of copper on a substrate, and is characterised in that the copper forming the printed circuits is transferred by a hot embossing onto the substrate with the heat required for hot embossing being generated in a carrier film for the copper.

DETAILED DESCRIPTION

Figure 1:
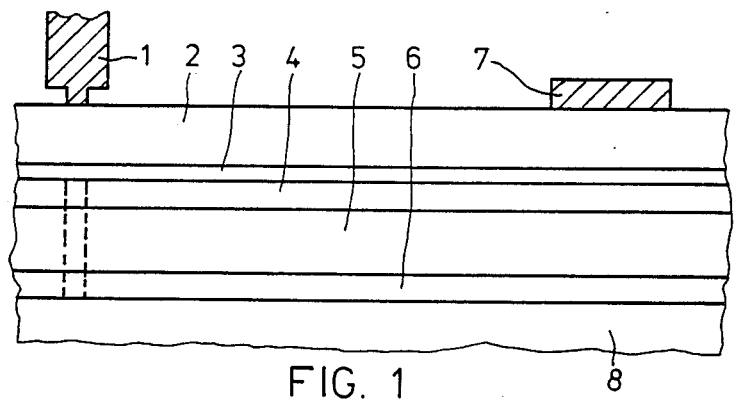
FIG. 1 illustrates the embodiment of this invention wherein the electrodes contact a carrier film overlying an aluminum layer, overlying a meltable separation layer, overlying a copper foil layer, overlying a heat activated adhesive layer, overlying a base or substrate.

In the manufacture of printed circuits according to the invention, the heat energy necessary for melting the separation layer and activating the hot seal layer is no longer introduced by a heat embossing tool. Rather, it is directly generated in the carrier tape of the copper foil. In addition, the embossing tool remains unchanged in its mechanical qualities, that is, it is provided with the raised picture or configuration of the strip conductors. In a special embodiment the picture is transferred onto printed circuits which are for their part attached to the embossing stamp.

In particular, the present invention relates to a method of manufacturing printed electrical circuits which comprise a substrate and copper foil applied thereto by hot embossing in a predetermined circuit pattern, said method comprising (a) providing a laminate which comprises the sequence of a printed circuit substrate, a heat activated adhesive layer, a copper foil and a carrier film which is electrically conductive, (b) passing an electrical current between two electrodes and through the carrier film wherein one electrode has sufficiently large film contact area whereby substantially no resistance heating results from the current density and the other electrode serves as an embossing tool and is of sufficiently small film contact area whereby sufficient resistance heating results from the current density to activate the adhesive layer to bond the copper foil to the substrate in the pattern of said other electrode, and (c) removing from the laminate the carrier film and such copper foil overlying areas where the adhesive was not heat activated, thereby leaving a copper foil pattern bonded to the substrate.

The present invention will now be described in greater detail in connection with the three figures which make up the drawing.

By contrast with the known process, embossing tool (1) is however no longer heated according to the invention, but is developed as an electrical electrode. The heat required for the transfer of the strip conductors is generated in carrier film (2) of copper foil (5), (see FIG. 1). In addition the carrier foil is produced from a synthetic film fitted with electrically conducting soot. The embossing tool is placed across the machine frame and grounded, while the current supply takes place from electrode (7) connected with a suitable current source. The current flows practially without looses from the electrodes (7) to the embossing tool (1) across an aluminum layer (3) vacuum metallized onto the carrier film (2) under high vacuum conditions. The contact surface of electrode (7) is therein to be chosen so as to be larger than the contact surface of embossing tool (1), so that the current density is so great only in the region of embossing tool (1) that sufficiently high temperatures arise in carrier foil (2), in order to melt separation layer (4) and activate adhesive layer (6). By this means, copper foil (5) is glued according to the image predetermined by embossing tool (1) to substrate (8). During separation of carrier foil (2) from substrate (8), the bonded strip conductor adheres to the substrate and is itself protected against oxidation and soiling by the separation layer which is also adherent to the copper foil.

Figure 2:
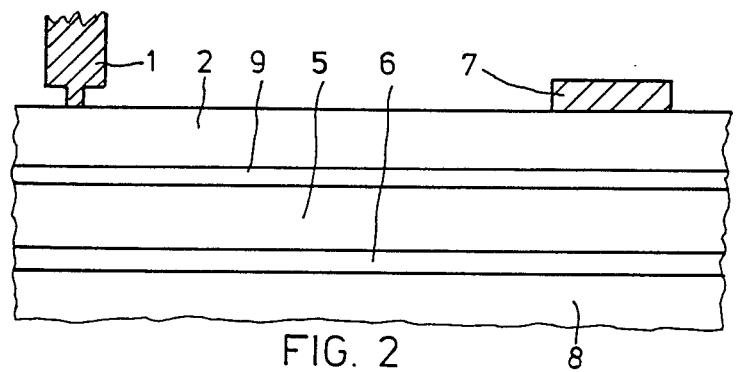
FIG. 2 illustrates an embodiment of this invention wherein the electrodes contact a carrier film overlying a conductive adhesive layer, overlying a copper foil layer, overlying a heat activated adhesive layer, all overlying the substrate.

In a different embodiment of the present invention (see FIG. 2) vacuum metallized* aluminum layer (3) and separation layer (4) out of FIG. 1 are replaced by an electrically conducting adhesive (9). The electrically conducting adhesive (9) has a specific conduction resistance that is similar to that of carrier foil (2). The practically loss-free current conduction occurs in this embodiment across copper foil (5).

Figure 3:
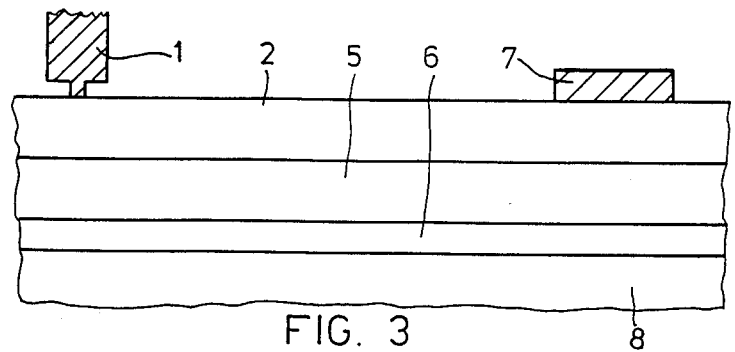
FIG. 3 illustrates an embodiment of this invention wherein the electrodes contact a carrier film which overlies a copper film layer, overlying a heat activated adhesive layer, all overlying the substrate.

In a further embodiment (see FIG. 3) copper foil (5) is directly layered with carrier foil (2). This layering can take place by means of extruding or perfusing. This embodiment makes use of the circumstance that in the direct layering of copper with a synthetic material in general only weak bonding forces arise.

The carrier foil (2) is manufactured by melt extruding or perfusing. Synthetic materials and processes are suitale with which, by means of the working in of conduction soots customary in the trade, a specific conductant resistance of 0.05 to 1,000Ω·cm (Ohm·cm) preferably 0.1 to 200Ω·cm (Ohm·cm) and most especially preferred 0.5 to 10Ω·cm (Ohm·cm) can be achieved with sufficient mechanical characteristics and sufficiently low tolerances of the specific conduction resistance.

Suitable materials are, for example, polycarbonate, polyamide, polyester. Polycarbonate is preferably used.

The copper foil (5) is preferably a sintered copper that is of sufficiently low shear resistance for achieving of sharp-edged strip conductors.

The separation layer (3) may be a melt adhesive with a melting region between 30° and 150°, preferably 40°-60°.

The adhesive layer (6) is a heat-activable adhesive with an activation temperature of more than 150° C.

Duroplastic and thermoplastic materials, which correspond in their characteristic profile to the requirements for base material for printed circuits, may be used.

The aluminum layer (3) is preferably manufactured by the vacuum metallizing of aluminum on carrier foil (2) in a high vacuum. The surface resistance of the aluminum layer lies between 0.01 and 10 ohms, preferably between 0.5 to 2.0 ohms.

The object of the invention will be explained in further detail by reference to the following example which is merely illustrative and does not limit the invention.

EXAMPLE

The image of a strip conductor layout is transferred to the embossing tool by photo-etching. The strip conductor rails are raised by 1 mm.

A soot-filled polycarbonate film (Macrofol® VP KL 3-1009 of Bayer AG, Leverkusen), film thickness 0.02 mm, is layered with aluminum over its whole surface on a tape vacuum metallizing installation. The surface resistance of the L-layer is 0.6 ohms.

A copper foil of sintered copper is first layered with a heat-activable adhesive in a layering installation. The layered copper foil is laminated with its unlayered side on the aluminum-layered side of the synthetic foil under addition of a melting adhesive.

The foil combination thus obtained is placed on a substrate material and electrode and embossing tool are placed on top. By a current impulse and with a current density of 150 mA/mm$^2$ printed circuit surface and a duration of 0.1 s the copper foil is glued onto the substrate. Pulling off the carrier foil the copper foil remains adherent according to the embossing image and tears off cleanly at the adhesive edges.

What is claimed is:

1. A method of manufacturing printed electrical circuits which comprise a substrate and copper foil applied thereto by hot embossing in a predetermined circuit pattern, said method comprising
   (a) providing a laminate which comprises the sequence of a printed circuit substrate, a heat activatable adhesive layer, a copper foil and a carrier film which is electrically conductive,
   (b) passing an electrical current between two electrodes and through the carrier film wherein one electrode has sufficiently large film contact area whereby substantially no resistance heating results from the current density and the other electrode serves as an embossing tool and is of no sufficiently small film contact area whereby sufficient resistance heating results from the current density to activate the adhesive layer to bond the copper foil to the substrate in the pattern of said other electrode, and
   (c) removing from the laminate the carrier film and such copper foil overlying areas where the adhesive was not heat activated, thereby leaving a copper foil pattern bonded to the substrate.

2. A method according to claim 1 wherein the carrier film is a soot-filled polycarbonate film.

3. A method according to claim 1 wherein the carrier film has a specific conductant resistance of 0.05 to 1,000Ω·cm (Ohm·cm).

4. A method according to claim 1 wherein the copper foil comprises sintered copper.

5. A method according to claim 1 wherein the heat activator adhesive has an activation temperature of at least 150° C.

6. A method according to claim 1 wherein between the copper foil layer and the carrier film, an aluminum layer and a meltable separation layer are provided with the aluminum layer abutting the carrier film.

7. A method according to claim 6 wherein the meltable separation layer is a melt adhesive melting between 30° and 150° C.

8. A method according to claim 6 wherein the aluminum layer is provided by vacuum metallizing aluminum metal onto the carrier film.

9. A method according to claim 6 wherein the aluminum layer has a surface resistance from 0.01 to 10 ohms.

10. A method according to claim 1 wherein a layer of electrically conductive adhesive is provided between the carrier film and the copper foil.

11. A method according to claim 10 wherein the conductive adhesive layer has substantially the same specific conduction resistance as the carrier film.

* * * * *